United States Patent
Shing et al.

(10) Patent No.: US 6,905,970 B2
(45) Date of Patent: Jun. 14, 2005

(54) METHOD FOR MAKING A THIN FILM BULK ACOUSTIC-WAVE RESONATOR

(75) Inventors: Tai-Kang Shing, Hsinchu (TW);
Chih-Chen Lee, Taipei (TW);
Chien-Hsiung Tai, Kaosiung (TW)

(73) Assignee: Industrial Technology Research Institute, Hsinchu (TW)

( * ) Notice: Subject to any disclaimer, the term of this patent is extended or adjusted under 35 U.S.C. 154(b) by 257 days.

(21) Appl. No.: 10/294,752

(22) Filed: Nov. 15, 2002

(65) Prior Publication Data

US 2003/0094431 A1 May 22, 2003

(30) Foreign Application Priority Data

Nov. 20, 2001 (TW) .......................................... 90128644

(51) Int. Cl.⁷ ........................................... H01L 21/302
(52) U.S. Cl. ....................... 438/706; 438/422; 438/692; 438/745; 216/17
(58) Field of Search ................................. 438/477, 427, 438/456, 691, 692, 706, 710, 717, 720, 745, 422; 333/187, 193

(56) References Cited

U.S. PATENT DOCUMENTS

| | | | |
|---|---|---|---|
| 6,060,818 A | | 5/2000 | Ruby et al. |
| 6,182,513 B1 | * | 2/2001 | Stemme et al. ............... 73/704 |
| 6,384,697 B1 | * | 5/2002 | Ruby .......................... 333/189 |

* cited by examiner

*Primary Examiner*—Lan Vinh
(74) *Attorney, Agent, or Firm*—Birch, Stewart, Kolasch & Birch, LLP

(57) ABSTRACT

A method for making a thin film bulk acoustic-wave resonator (FBAR). First, define the cavity area on a substrate. Secondly, partially etch the patterned cavity area as a presacrificial layer. Thirdly, modify the nature of the presacrificial layer as a sacrificial layer, for example, using oxidization. Fourthly, polish the upper surface of the substrate and form the FBAR structure. Finally, remove the sacrificial layer to form the reflection cavity.

13 Claims, 5 Drawing Sheets

METHOD FOR MAKING A THIN FILM BULK ACOUSTIC-WAVE RESONATOR

BACKGROUND OF THE INVENTION

1. Field of Invention

The invention relates to a fabrication method for a thin film bulk acoustic-wave resonator (FBAR) and more particularly, the filters and duplexers made by such resonators.

2. Related Art

Filters are widely used in wireless communications. The demand is roughly estimated to be tens of billions annually. The commonly used filters include LC filters, dielectric filters, surface acoustic wave (SAW) filters, and thin film bulk acoustic-wave (BAW) filters. Since the thin film bulk acoustic-wave filter is featured in its small size, high-frequency capability, low insertion loss, and being able to readily integrate with integrated circuits (ICs), it is expected to have a wider applications in the future. The thin film bulk acoustic-wave filter is composed of thin film bulk acoustic wave resonator (FBAR). A typical FBAR is mainly composed of top/bottom electrodes and piezoelectric layers (e.g., PZT, AlN and ZnO) in between. Sometimes, a supporting or temperature compensation layer is also used. Piezoelectric layers are used here to make transduction between the electrical signal and acoustic wave. In order to effectively trap the energy inside the resonator, some special structure is made to reflect the elastic wave and trap them by means of the impedance difference. The special structure is usually an air cavity underneath the bottom electrode made by micro electro-mechanic system (MEMS) techniques. Another way to make low impedance reflection structure is to create a Bragg reflector. The latter method requires high film quality of each layer.

Currently, the cavity of the thin film bulk acoustic wave resonator is usually made using MEMS technology. There are two ways to implement it: bulk micromachining and surface micromachining. Please refer to FIG. 1 for the surface micromachining. This method makes a bridge 11 above the substrate 10 and removes the sacrificial layer 12 below the bridge 11 later to form a reflection cavity of the resonator. However, this method is not widely adopted because removing the sacrificial layer 12 from underneath the bridge 11 is a difficult job and the bridge structure can be easily damaged, too.

Most popular fabrication method is the bulk micromachining. One can etch from the backside of a substrate, leaving a very thin structure layer. Alternatively, one may directly dig a cavity underneath FBAR structure from the front side of substrate. In this case, the process integration is an important issue. Several drawbacks, however, exist for these conventional fabrication methods. The etching solutions usually used, for example, may have compatibility problems with existing CMOS processes and cause contamination problems. The anisotropic characteristics of some etching solutions are widely used to make precise shape control but will limit the shape choices for the cavity. Nevertheless, the etching solution may damage the already formed structure and the circuit.

FIG. 2 shows a schematic cross-sectional view of a FBAR fabricated using the conventional bulk micromachining. First, an FBAR structure 22 is formed on a substrate 20. Afterwards, the substrate 20 is etched from the backside until a very thin structure layer 21 is formed. This backside etching method has its advantage of easy fabrication. However, it requires a larger fabrication area and the wafer becomes brittle after etching, causing handling problems.

Please refer to FIGS. 3A to 3E for another excavation micromachining method developed by Agilent (disclosed in U.S. Pat. No. 6,060,818). This method first etches a substrate 30 from the front side by bulk micromachining to obtain a desired cavity 31 (FIG. 3A). The cavity 31 is then oxidized (by thermal oxidation, not shown in the drawing) and filled with a phosphosilicate glass (PSG) layer 32 (FIG. 3B). As shown in FIG. 3C, the PSG layer 32 is polished using the chemical-mechanical polishing (CMP) method. Thin film bulk acoustic-wave resonator structures 33 are then formed on the polished PSG layer 32 (FIG. 3D). Afterwards, a diluted $H_2O$:HF solution is used to rapidly remove PSG layer 32 and create the cavity 34 required for forming the working resonators (FIG. 3E). This method etches from the front side and has the advantage of a small area. Such a method has some problems, such as a complicated fabrication procedure and limited cavity shapes if anisotropic etchants are used.

Porous silicon fabrication methods are also used to implement FBAR, as shown in FIG. 4. Porous silicon 41 is formed on the Si substrate first. Thin film bulk acoustic-wave resonator (FBARs) structures 42 are then formed on the porous silicon 41. Finally, the porous silicon 41 under the FBARs is removed using 2% NaOH. This method requires an n/n+/n structure. The etching solution, NaOH (or KOH), is not accepted by CMOS fabrication lines. Moreover, this method requires a complicated manufacturing process and a higher fabrication cost.

SUMMARY OF THE INVENTION

In view of the foregoing, the invention provides a method for making a thin film bulk acoustic-wave resonator. The cavity definition area (usually square but can be any shape) is first partially etched and then oxidized into silicon oxide. A thin film acoustic-wave filter structure is then made thereon. Finally, a designated shape cavity is formed using the etching solution (usually BOE) of the silicon oxide from the front side of substrate. This avoids the trouble of using unfamiliar etching solutions, and the required steps of forming FBAR are also less.

The disclosed method first partially etches the cavity and then the exposed part is transformed into complete silicon oxide as the sacrificial layer using thermal oxidation. The left exposed part is calculated according to Si oxidation ratio. After polishing away unnecessary silicon oxide, FBARs are formed thereon. Finally, a diluted aqueous HF solution is used to rapidly remove the silicon oxide.

The invention provides a method for making a thin film bulk acoustic-wave resonator that includes the steps of: defining a cavity area on a silicon substrate; etching the cavity area into a presacrificial layer; modifying the nature of the presacrificial layer as a sacrificial layer; polishing the upper surface of the substrate and the sacrificial layer; forming the FBAR structure; and removing the sacrificial layer to form the reflection cavity.

The presacrificial layer can be several $\mu$m deep and consist of thin etched grooves. The depth is the required depth for the cavity of the FBAR. One may also use the fabrication method of making porous silicon to prepare the presacrificial layer. The method of modifying the nature of the presacrificial layer can be oxidation.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The invention uses a method compatible with the CMOS fabrication processes to make thin film bulk acoustic-wave resonators. Please refer to FIGS. 5A to 5F. They correspond to six steps of the disclosed fabrication method. First, define a cavity area on a substrate. Secondly, partially etch the patterned cavity area as a presacrificial layer. Thirdly, modify the nature of the presacrificial layer as a sacrificial layer, for example, using oxidization. Fourthly, polish the upper surface of the substrate and form the FBAR structure. Finally, remove the sacrificial layer to form the reflection cavity.

Figure 1:
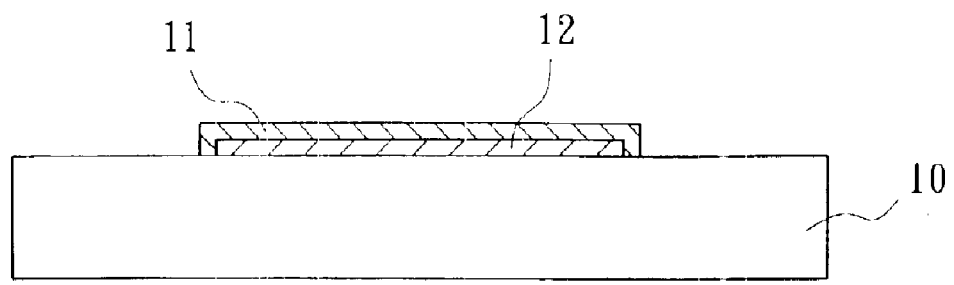
FIG. 1 shows a schematic cross-sectional view of making a resonator using the surface micromachining method.
Figure 2:
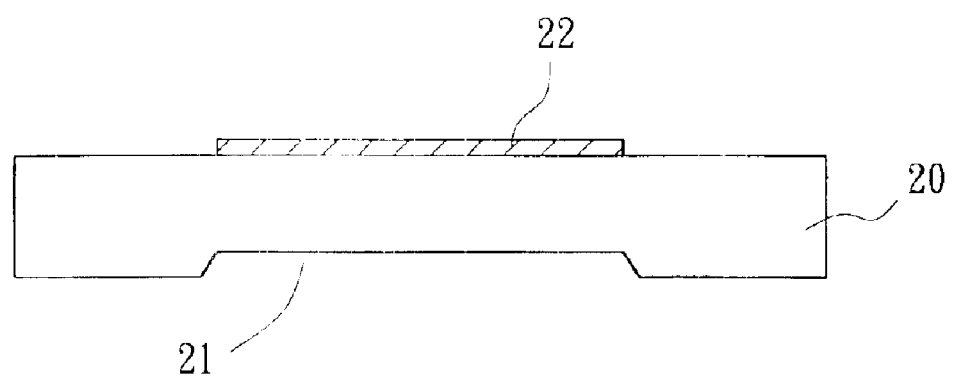
FIG. 2 shows a schematic cross-sectional view of making a resonator using the bulk backside micromachining method.
Figure 3A:
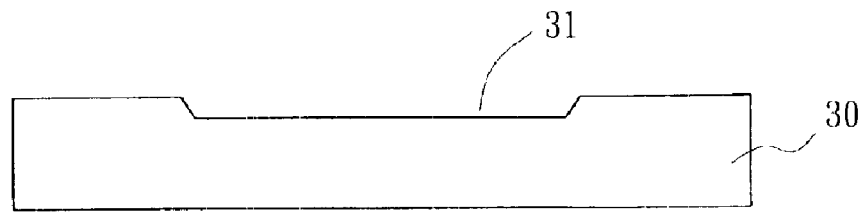
FIGS. 3A to 3E are schematic cross-sectional views of making a resonator using the front-side excavation micromachining method.
Figure 3B:
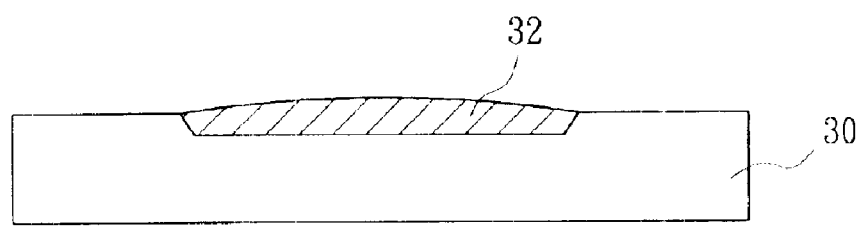
Figure 3C:
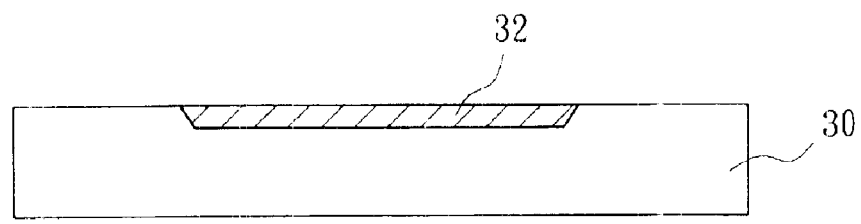
Figure 3D:
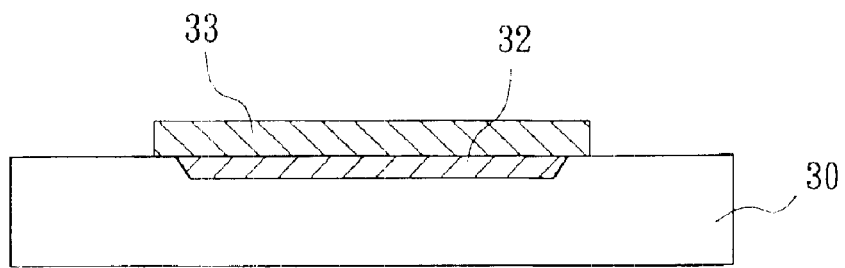
Figure 3E:
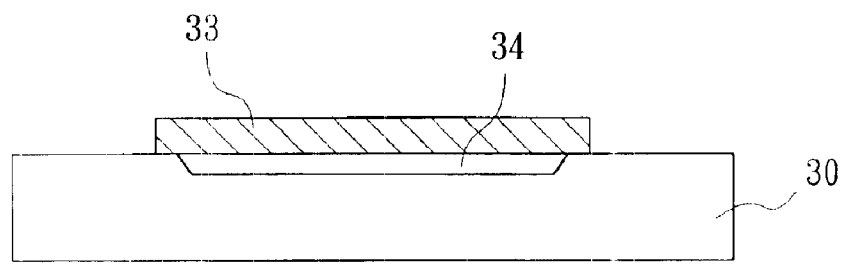
Figure 4:
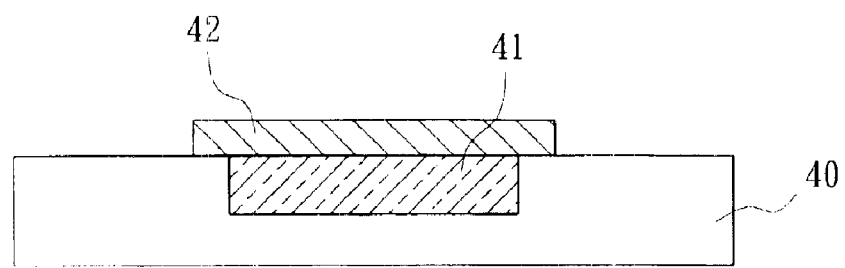
FIG. 4 is a schematic view of making a resonator using the porous silicon micromachining method.
Figure 5A:
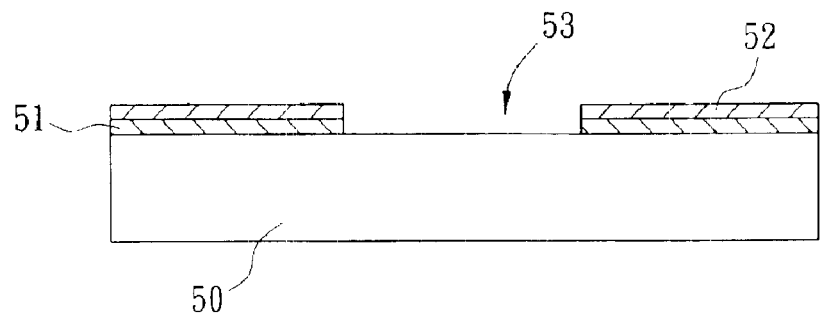
FIGS. 5A to 5F show detailed procedures of making a thin film bulk acoustic-wave resonator according to the invention.

As shown in FIG. 5A, the first step is to define a cavity area on a silicon substrate. This step uses the patterning method using the conventional IC fabrication process. A silicon oxide layer 51 and a silicon nitride 52 are first deposited on a silicon substrate 50. An opening is then made at the place for a cavity 53. One can employ reactive ion etching (RIE) to remove the silicon oxide 51 and the silicon nitride 52, exposing the silicon substrate 50.

Figure 5B:
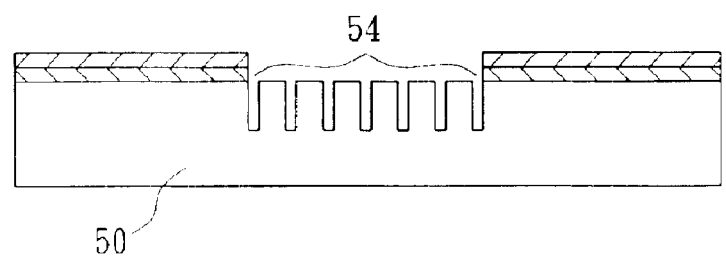

In the second step, the patterned cavity area on the silicon substrate is partially etched to form a presacrificial area 54, as shown in FIG. 5B. After patterning, the cavity area and the necessary presacrificial area 54, one may use the inductive coupled plasma reactive ion etching (ICP) method to create the presacrificial layer 54 on the silicon substrate 50. One may choose to make deep and thin etched grooves or make porous silicon to form the presacrificial layer 54. The etching depth is determined according to the required depth of the reflection cavity. The above-mentioned etched grooves and porous silicon are simply two examples of many possible ways.

Figure 5C:
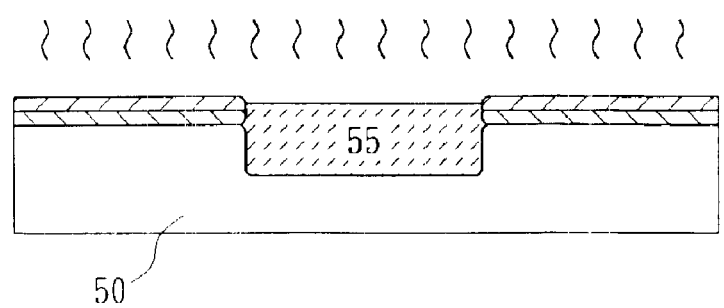
Figure 5D:
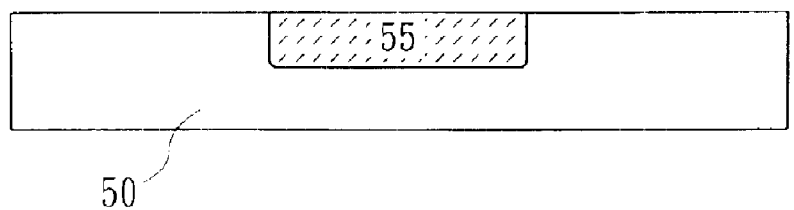

In the third step of the invention, the nature of the presacrificial layer 54 in the cavity area of the silicon substrate is modified to form a sacrificial layer, as shown in FIG. 5C. Using either the groove etching or porous silicon formation, the silicon ingredients left inside the cavity area have to be completely oxidized into silicon oxide. This can be achieved by passing the silicon substrate 50 through a furnace via thermal oxidation. That is, one can properly adjust the oxidation time and transform the partial etching silicon part into a complete oxidation layer 55 thanks to silicon dioxide volume inflation. The silicon oxide 55 thus formed is the sacrificial layer required in the invention. The basic principle in the formation of the sacrificial layer 55 is to totally change the nature of the cavity area (such oxidation or nitridation). Alternatively, one can use other methods, such as nitridation, to process the presacrificial layer to form the sacrificial layer. The desired reflection cavity can be formed by removing the sacrificial layer later.

In the fourth step, the silicon oxide 55 and the silicon substrate 50 have to be planarized in order to continue to the next step. The planarization can be achieved using the chemical-mechanical polishing (CMP), removing unnecessary silicon oxide 55 and forming a planar structure (see FIG. 5D).

Figure 5E:
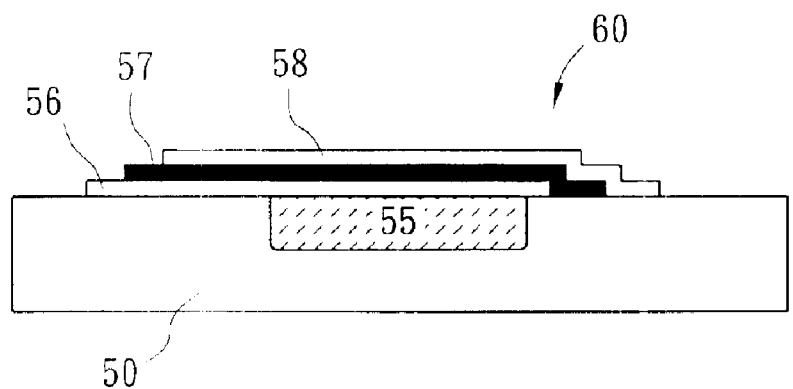

After planarizing the silicon substrate surface, the fifth step is to make a thin film bulk acoustic-wave resonator structure 60 above the sacrificial layer 55 and the silicon substrate 50 (FIG. 5E). In this step, the silicon substrate is deposited in the order of a bottom electrode layer 56, a piezoelectric thin film layer 57, and a top electrode layer 58. The bottom electrode layer 56 and the top electrode layer 58 can be made of aluminum, molybdenum, platinum or gold. The piezoelectric thin film layer 57 can be made of AlN, ZnO, or $Pb(Zr,Ti)O_3$ (PZT). The materials of choice depend on the bandwidth, operation frequency, and insertion loss etc.

Figure 5F:
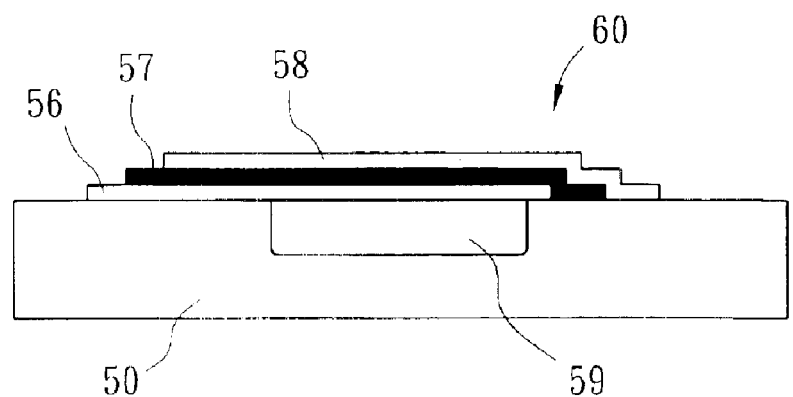

In the last step, the sacrificial layer is removed to form a reflection cavity 59, as shown in FIG. 5F. After the sacrificial layer is removed, the space left over underneath FBAR structure is the reflection cavity 59 required for the resonator according to the invention. A method to implement this step is to use a diluted HF aqueous solution compatible with the normal IC fabrication processes to rapidly remove the silicon oxide, forming a cavity 59.

Effects of the Invention

The disclosed method for making a thin film bulk acoustic-wave resonator is cost-effective and compatible with normal IC fabrication processes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for making a thin film bulk acoustic-wave resonator (FBAR) comprising the steps of:

defining a cavity area on a substrate;

partially etching the cavity area of the substrate into a presacrificial layer;

modifying the nature of the presacrificial layer in the cavity area of the substrate to form a sacrificial layer;

polishing the upper surface of the substrate;

forming a FBAR structure above the substrate and the sacrificial layer; and removing the sacrificial layer to form a cavity, wherein the presacrificial layer consists of etched grooves formed by using dry etching method.

2. The method of claim 1, wherein the material of the substrate is selected from the group consisting of Silicon, GaAs, Glass, or Quartz.

3. The method of claim 1, wherein the definition of the cavity area is performed by growing a silicon oxide layer and then removing the silicon oxide above the desired cavity area.

4. The method of claim 3, wherein the definition of the cavity area further comprises the step of depositing a silicon nitride layer after depositing the silicon oxide layer, followed by the step of removing the silicon nitride layer and the silicon oxide layer above the desired cavity area.

5. The method of claim 1, wherein the dry etching method is the inductive coupled plasma reactive ion etching (ICP) method.

6. The method of claim 1, wherein the presacrificial layer is formed using the porous silicon formation method.

7. The method of claim 1, wherein the step of polishing the upper surface of the substrate is achieved by a chemical-mechanical polishing (CMP) method.

8. The method of claim 1, wherein the step of removing the sacrificial layer is achieved using a diluted HF aqueous solution.

9. The method of claim 1, wherein the step of forming the sacrificial layer is done by passing the substrate through a furnace, and completely oxidizing the partial etching area in the presacrificial layer by thermal oxidation.

10. The method of claim 9, wherein the step of removing the sacrificial layer is achieved using a diluted HF aqueous solution.

11. The method of claim 1, wherein the step of forming the FBAR is achieved by depositing a bottom electrode layer, a piezoelectric thin film layer, and a top electrode layer.

12. The method of claim 11, wherein the material of the bottom electrode layer and the top electrode layer is selected from the group consisting of aluminum, molybdenum, platinum and gold.

13. The method of claim 11, wherein the material of the piezoelectric thin film layer is selected from the group consisting of AlN, ZnO and $Pb(Zr,Ti)O_3$ (PZT).

* * * * *